United States Patent [19]

Wilson

[11] 4,318,087
[45] Mar. 2, 1982

[54] SWITCH CLOSURE SENSING CIRCUIT

[75] Inventor: Robert E. Wilson, Whitehouse Station, N.J.

[73] Assignee: RCA Corporation, New York, N.Y.

[21] Appl. No.: 184,952

[22] Filed: Sep. 8, 1980

[51] Int. Cl.³ .............................................. G06F 3/02
[52] U.S. Cl. ................................ 340/365 S; 364/707
[58] Field of Search ............ 340/365 S, 365 R, 166 R, 340/365 E; 179/90 K; 84/1.01; 178/17 C; 364/707

[56] References Cited

U.S. PATENT DOCUMENTS

| 4,148,017 | 4/1979 | Tomisawa | 84/1.01 |
| 4,170,768 | 10/1979 | Kitagawa | 84/1.01 |
| 4,251,805 | 2/1981 | Holzmann et al. | 340/365 S |

FOREIGN PATENT DOCUMENTS 2012461 7/1979 United Kingdom ............ 340/365 S

Primary Examiner—Gerald L. Brigance
Attorney, Agent, or Firm—Samuel Cohen; Henry I. Schanzer

[57] ABSTRACT

A keyboard system includes a row and a column matrix of electrically isolated conductors with a key switch at each intersection which is effective, when closed, to electrically connect the associated intersecting row and column conductors. The conduction path of a column transistor is connected between each column conductor and a first power terminal and the gate-to-source region of a respective row transistor is connected between each row conductor and a second power terminal. The column transistors are turned-on prior to any switch closure. Therefore, when a switch is closed, its associated column transistor provides a very low impedance, low voltage drop, path between the first power terminal and the row transistor connected to the row conductor associated with the switch. The row transistor is then turned-on if the operating voltage applied between the first and second power terminal exceeds the threshold voltage of the row transistor. A normally off pulse generating system is coupled between the drains of the row transistors and the control electrodes of the column transistors. The pulse operating system is activated in response to a switch closure and sequentially scans the column transistors. The column transistor whose column conductor is connected to a closed switch then produces a signal indicative of the closure. The circuitry in the pulse generating system is operable down to one threshold voltage, whereby the whole system operates at very low voltages.

10 Claims, 3 Drawing Figures

SWITCH CLOSURE SENSING CIRCUIT

This invention relates to switch closure sensing circuitry particularly useful in conjunction with keyboards.

A keyboard comprising a plurality of push-button switches may be used, for example, in touch-tone telephone dialing systems, electronic calculators, and other types of electronic equipment. Where the keyboard is to be of low cost and simple construction, the keyboard may comprise, for example, a matrix array of row and column conductors electrically isolated from each other with the row conductors disposed orthogonally to the column conductors, and with a switch located at each intersection of a row and a column conductor. A switch when depressed (closed) connects its associated row conductor to its associated column conductor. The row and column data corresponding to the closure of a switch activate electronic circuits coupled to the switch. [In the discussion to follow, and in the appended claims, certain conductors are referred to as row conductors and other conductors are referred to as column conductors. This is done for ease of description only. The row and column conductors could be interchanged or be either of a first and a second set of conductors.]

In a known keyboard system described in my copending application, Ser. No. 103,924 filed Dec. 17, 1979 entitled LOW POWER SWITCH CLOSURE SENSING CIRCUIT, and assigned to the assignee of the present invention, a column sensing circuit is connected to each column conductor and a row sensing circuit is connected to each row conductor. A switch closure activates the column and row sensing circuits associated with that switch, and the corresponding input information is fed to the system. The sensing portions of the column and of the row sensing circuits are connected in series and each requires a minimum voltage level (a threshold) to be operable. It is, therefore, necessary that the operating voltage applied to the keyboard system be equal to or greater than two thresholds—twice the minimum voltage level—in order to simultaneously operate the column and row sensing circuits associated with a closed key switch.

This presents a problem where the system is to be operable, and the row and column information corresponding to a switch closure is to be valid, at operating voltages close to the minimum (one threshold) voltage level. Thus, a problem exists in those applications where it is desirable and/or necessary that the system operate at very low voltages and that row and column signals indicative of a switch closure be produced at these low voltages. Concurrently, it is essential that there be little, if any, power dissipation in the electronic sensing circuits in the quiescent state (i.e. when no switches are depressed).

This problem is solved in circuits embodying the invention by having one of the column and row sensing circuits function to provide low impedance loads (requiring very little voltage drops) for the other one of the column and row sensing circuits (requiring one threshold voltage). The combination can then function at operating voltages down to almost one threshold voltage level.

By way of example, a particular keyboard system embodying the invention includes a row and column matrix of electrically isolated conductors having a key switch at each intersection which is effective, when closed, to electrically couple the intersecting row and column conductors associated therewith. Each of the column conductors is connected via the low impedance conduction path of a column sensing circuit to a first point of operating potential. Each of the row conductors is connected to the input of a row sensing circuit which has a common point returned to a second point of operating potential and which is operable when the potential applied between its input and common point exceeds a given value defined as the threshold level. In response to a switch closure, a column sensing circuit, provides a low impedance conduction path between a first point of operating potential and the input to a row sensing circuit. Essentially the full operating potential between the first and second points of operating potential appears across the input and common point of a row sensing circuit. If the value of the operating potential exceeds the threshold level of the row sensing circuit, it is activated. In response to the activation of a row sensing circuit, a normally OFF pulse generator is turned-ON and produces scanning pulses which are sequentially applied to the column sensing circuits. When scanned, the column sensing circuit associated with the closed switch provides a conduction path via the closed switch which then produces a signal indicative of the selected column. Therefore, signals indicative of the selected row and column are produced at operating voltages close to one threshold level—the threshold level of the row sensing circuits.

In the accompanying drawing like reference characters denote like components, and;

Figure 1:
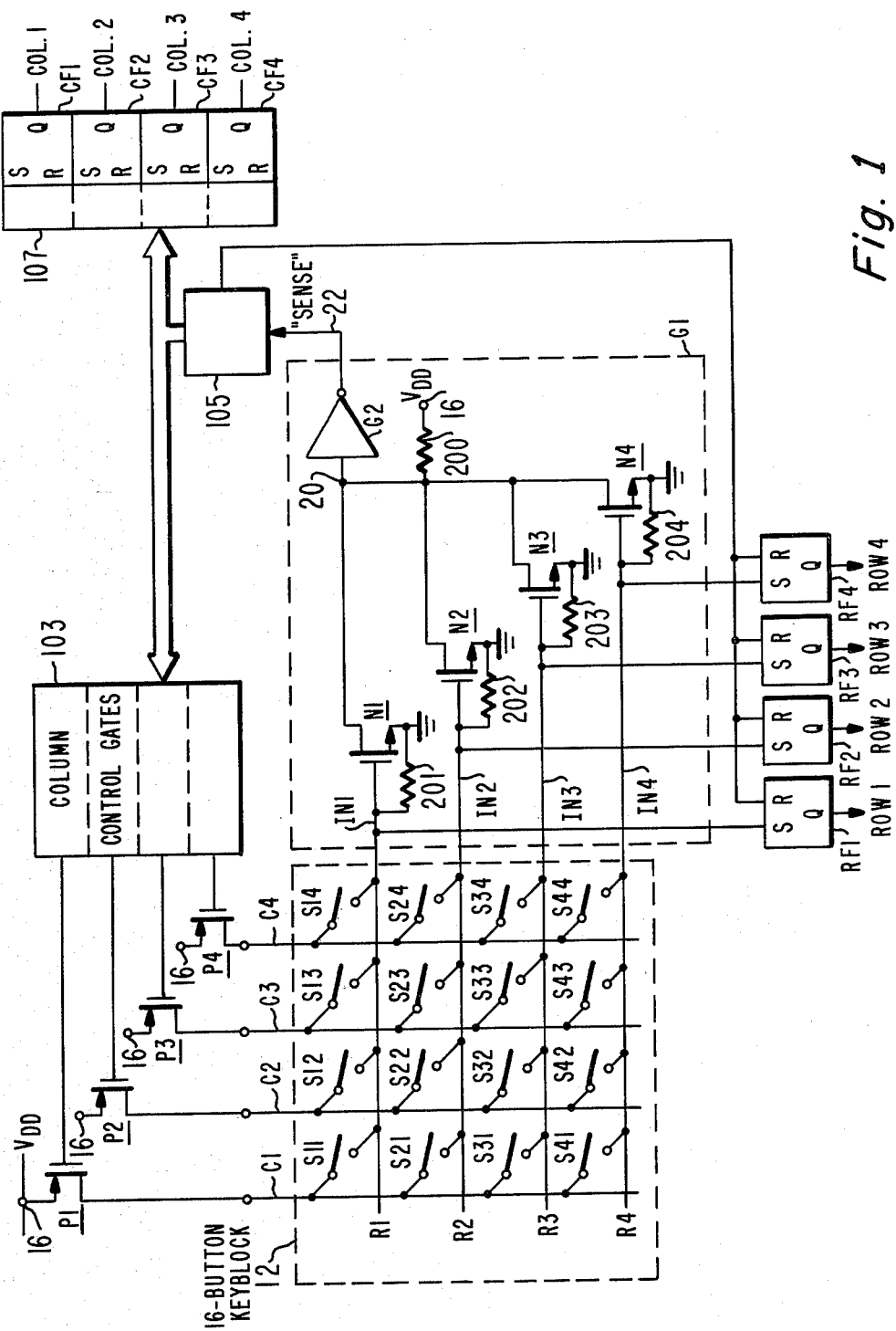
FIG. 1 is a partial block, partial schematic diagram of a keyboard system embodying the invention.

The system of FIG. 1 includes a keyboard 12 composed of an array of sixteen (16) single-pole, single-throw, push-button switches (Sij) disposed in four (4) rows and four (4) columns. Corresponding to each row there is a row conductor (R1, R2, R3 and R4) and corresponding to each column there is a column conductor (C1, C2, C3, C4). The column conductors are disposed in an orthogonal direction to the row conductors, with the row and column conductors being electrically isolated from each other.

A key switch (Sij) is connected between a row and a column conductor at each intersection of a row and a column conductor. Each switch (Sij) is denoted by the letter S followed by two reference numerals, the first numeral identifies the row (Ri) to which one terminal of the switch is connected and the second numeral identifies the column (Cj) to which the other terminal of the switch is connected. The keyboard 12 can be, for example, mounted on a telephone.

Normally, the key switches (Sij) are in the open position. When a key switch is depressed, the switch interconnects the corresponding row and column conductors via a negligible impedance connection.

Each column conductor (Cj) is connected to the drain of a P-type column transistor (Pj) whose source electrode is connected to a power terminal 16 to which is applied an operating voltage of $V_{DD}$ volts. The source-to-drain path of a current sourcing transistor (Pj) is thus connected between each column conductor and a first power terminal (16). The gate electrodes of the column transistors are connected to the outputs of a column transistor control circuit 103.

Each row conductor (Ri) is connected to an input INi of a 4-input OR gte G1 and to the respective set inputs of row flip-flops, RFi.

OR gate G1 has one input (INi) per row conductor (Ri) and includes one N-type row transistor (Ni) per row. Each row transistor is connected at its gate electrode to its respective row conductor, and at its source electrode to ground potential. The drains of the row transistors are connected in common to a node 20 to which is connected one terminal of a resistor 200 and the input of an inverter G2. The other terminal of resistor 200 is connected to terminal 16 and the output of G2 is connected to node 22 which defines the output of OR gate G1. OR gate G1 has been detailed, schematically, to show that the gate-to-source region of a transistor (Ni) is connected between each row conductor and ground. Similarly, although not shown, each one of the set inputs of the row flip-flops includes a transistor whose gate is connected to a row conductor. The sources of these transistors are returned to ground.

The row flip-flops (RFi) are of the set-reset type. When a "high" signal is applied to the set (S) input and a "low" signal is applied to the reset (R) input, the Q output of the flip flop goes high. When S=low and R=high the Q output of the flip-flop goes low. The set-reset flip-flops may, for example, comprise two cross-coupled NOR gates. However, any one of a number of known flip-flops could be used to perform the function.

The output of G1 is coupled to a normally non-running pulse generating and scanning circuit 105. Circuit 105, when running, produces scanning pulses which are sequentially applied to logic gates contained in column flip-flop circuit 107 and to logic gates contained in column transistor control circuit 103.

Column flip-flop circuit 107 includes one flip-flop (CFj) per column, with each flip-flop (CFj) being of the set-reset type like the row flip-flops. Each flip-flop has a Q output which, as described below is set high when a switch in its corresponding column is closed.

Control circuit 105 functions to provide a turn-on bias to the column transistors prior to a key-switch closure and to control the sequential application of scanning pulses to the column transistors after a switch closure.

The operation of the keyboard system is generally as follows. Prior to a key-switch closure, circuit 103 provides a turn-on bias to all of the column transistors (Pj); (i.e. a voltage of approximately zero volt is applied to their gate electrodes). Consequently, conductors Cj are charged to $V_{DD}$ volts via the low "ON" impedance of the source-to-drain path of their respective column transistors (Pj). Prior to a switch closure, the column transistors, although turned-on, conduct no current. The row conductors are held at or close to ground potential by means of the ground return resistors 201, 202, 203, and 204, and the output of G1 is low. The ground return resistors are normally of very high impedance. The Q outputs of the row and column flip-flops are low. Circuit 105 is not running whereby a signal is applied to control circuit 103 which, in response thereto, turns-on all of the column transistors.

When a key switch is closed, a negligible impedance connection is made between a column conductor and a row conductor, and the corresponding one of the column transistors (Pj) conducts in the common source mode and provides a low impedance conduction path (source-to-drain) between terminal 16 (which is at $V_{DD}$ volts) and the input (gate electrode) of one of the row transistors. The other row transistors (whether in OR gate G1 or in the row flip-flops) have their source electrodes connected to ground potential. Since the input impedance (gate-to-source) of a row transistor and the impedance of the associated resistor is very high and since the source-to-drain impedance of a column transistor is, relatively, very low, virtually the full $V_{DD}$ is applied to the gate electrode of a selected row transistor and its gate-to-source potential ($V_{GS}$) is approximately equal to $V_{DD}$. It is assumed in this discussion that $V_{DD}$ is close to, or greater than, the threshold voltage ($V_T$) of the row transistor. Hence, with an applied $V_{GS}$ equal to $V_{DD}$, the selected row transistor is turned-on and conducts. Thus, whenever a switch is closed, a signal very close to $V_{DD}$ is applied to one of the row conductors. Consequently, so long as $V_{DD}$ is greater than $V_T$, the transistors having their gate-to-source electrodes connected between that row conductor and ground are turned on. When any one of the row transistors in G1 is turned-on, it pulls node 20 and the input of inverter G2 towards ground potential. Inverter G2 then produces a positive going signal at node 22 denoted as the "SENSE" signal. Thus, whenever a key switch is closed a positive—high—"SENSE" signal is produced at node 22.

Concurrently, whenever a key switch is closed and $V_{DD}$ is applied to a row conductor, that $V_{DD}$ signal is applied to the set-input of the corresponding row flip flop. The row flip-flop (with a zero at its reset input) is then set and its Q output goes high indicating and identifying the selected row.

Concurrently, the positive going "SENSE" signal activates scanning circuitry which sets to a high the column flip-flop associated with the column in which a switch is closed, thus, indicating the column in which a switch was closed. This is accomplished without the necessity of circuitry requiring an additional (to the row circuit) threshold drop in series with the column conductors, as described below. A "high" sense signal activates the pulse generating circuit 105 which causes the removal of the turn-on bias to all of the column transistors. Circuit 105 then produces scanning pulses which are sequentially applied, via circuit 103, to the column transistors and which turns them on in sequence, each column transistor (Pj) being turned-on for the duration of its respective scan pulse period. The scanning pulses are concurrently applied via control gates to the column flip-flops (CFj). In particular, when a scan pulse is being applied to a column transistor (Pj) it is also being applied to a corresponding column flip-flop (CFj).

When a column transistor whose associated column conductor is not connected via a switch to a row conductor is turned-on by a scan pulse, the "sense" signal remains low and no column flip flop gets set. When a column tansistor is turned-on by a scan pulse and the transistor is connected via a closed switch to a row conductor, a positive going "sense" signal is produced which is applied concurrently with the scan pulse to the corresponding column flip flop. This causes the Q output of the column flip flop to be set "high" thereby indicating the column in which a switch is closed. Thus, the Q output of a column flip-flop is set "high"—to indicate a switch closure—only if both a "sense" signal and the corresponding scan pulse are present ("high").

It has thus been shown that a row and a column closure can be detected at very low voltages (i.e. close to one threshold). The row closure can be detected at very low voltages since the column circuitry, in series with the column conductors, function as low impedance, low voltage drop, loads for the row circuitry. The column closure can then be detected using scanning circuitry responsive to the (threshold requiring) row circuitry. The scanning circuitry does not need an operating voltage greater than that needed to operate the row circuitry. Hence, the remaining system circuitry can be made to function at operating voltages close to one threshold voltage. Hence, the keyboard system of FIG. 1 can operate with a $V_{DD}$ close to one threshold voltage.

Figure 2:
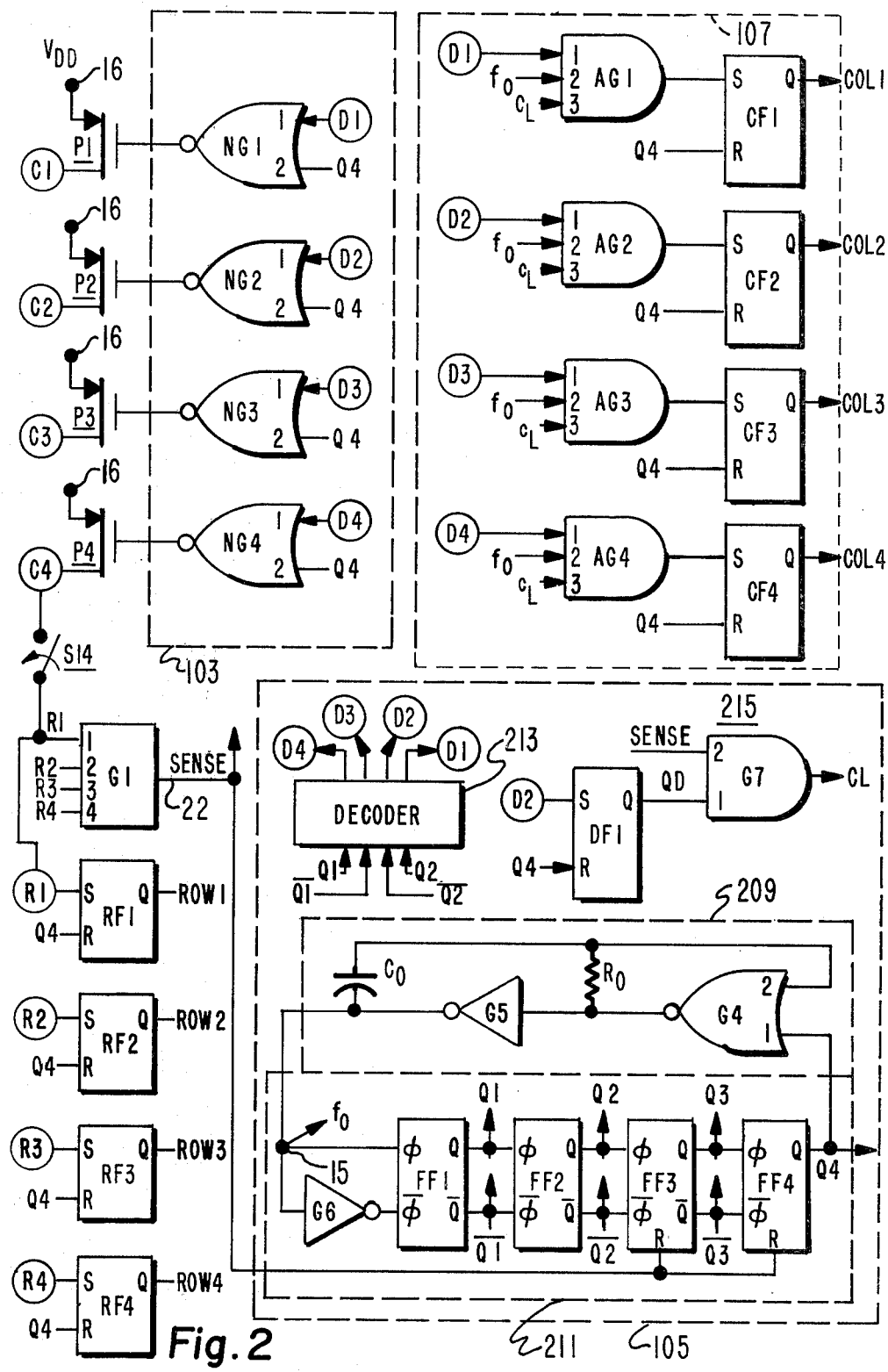
FIG. 2 is a partial block, partial schematic diagram detailing parts of the circuitry embodying the invention.

The scanning and column control circuitry is further detailed in FIG. 2, which illustrates the condition when a key switch is closed. By way of example, column conductor C4 is shown connected to row conductor R1 via switch S14. Row conductor R1 is connected to the set (S) input of a row flip-flop RF1 and to, input #1 of 4 input OR gate G1.

The pulse generator and scanner 105 includes a gated oscillator 209, a counter 211, a decoder 213, and a control circuit 215.

Oscillator 209 includes a two-input NOR gate G4 connected at its output to one terminal of a timing resistor $R_0$ and to the input of an inverter G5. The output of inverter G5 is connected at node 15 to one terminal of a capacitor $C_0$. The other terminal of $C_0$ and the other terminal of $R_0$ are connected to input #2 of G4. The operation of the oscillator circuit is described in an Application Note—ICAN—6267 entitled "Astable and Monostable Oscillators Using RCA COS/MOS Digital Integrated Circuits" by J. A. Dean and J. P. Rupley, published in RCA Solid State Data Book series, copyright 1972 by RCA Corporation. Suffice it to say that when the control signal to input #1 of G4 is "high", the oscillator is OFF (not running); the output of G4 is then low and the input of G5 is high. When the control signal to input 190 1 of G4 is "low" the oscillator is ON (runs) and oscillates as shown in waveform "$f_0$" of FIG. 3 at a frequency determined in part by $R_0$ and $C_0$.

Counter 211 includes four trigger type flip-flops (FF1, FF2, FF3, and FF4) connected in a binary divider counter chain. Each flip-flop has a $\phi$ and a $\bar{\phi}$ input and a Q and a $\bar{Q}$ output. These circuits are known and need not be detailed. For example, they are used in the RCA CD4020B 14-stage counter (Reference is made to FIG. 4 page 108 of the RCA Solid State Manual titled COS/MOS Integrated Cirvcuits, copyright 1978 by RCA Corporation.) The output of each flip-flop makes a transition when its $\phi$ input goes from high-to-low. The output $\bar{f_0}$ of oscillator 209 is applied to the $\bar{\phi}$ input of FF1 and $F_0$ produced by means of an inverter G6, is applied to the $\bar{\phi}$ input of FF1. The outputs (Q1, shown in waveform "Q1" of FIG. 3, and $\overline{Q1}$) of FF1 are applied to the inputs ($\phi$ and $\bar{\phi}$) of FF2 and to the decoder 213; the outputs (Q2, shown in waveform "Q2" of FIG. 3, and $\overline{Q2}$) of FF2 are applied to the inputs of FF3 and to the decoder 213; the outputs (Q3 and $\overline{Q3}$) of FF3 are applied to the inputs of FF4; the output Q4 of FF4 is applied to: (a) input #1 of G4; (b) the reset (R) inputs of the row and column flip-flops; (c) the reset (R) input of delay flip-flop DF1; and (d) input #2 of the column transistor control gates (NGi).

The output 22 of OR gate G1, designated "SENSE", is connected to the reset (R) inputs of FF3 and FF4.

The result of this connection is that whenever the output of G1 goes high (i.e. a switch closure is sensed), Q4 is driven "low". This: (a) turns the oscillator ON; (b) removes the reset from the row and column flip-flops; (c) removes the reset from DF1; and (d) removes the signal applied to the column transistor control gates (NGj) responsible for maintaining the column transistors turned-on.

Figure 3:
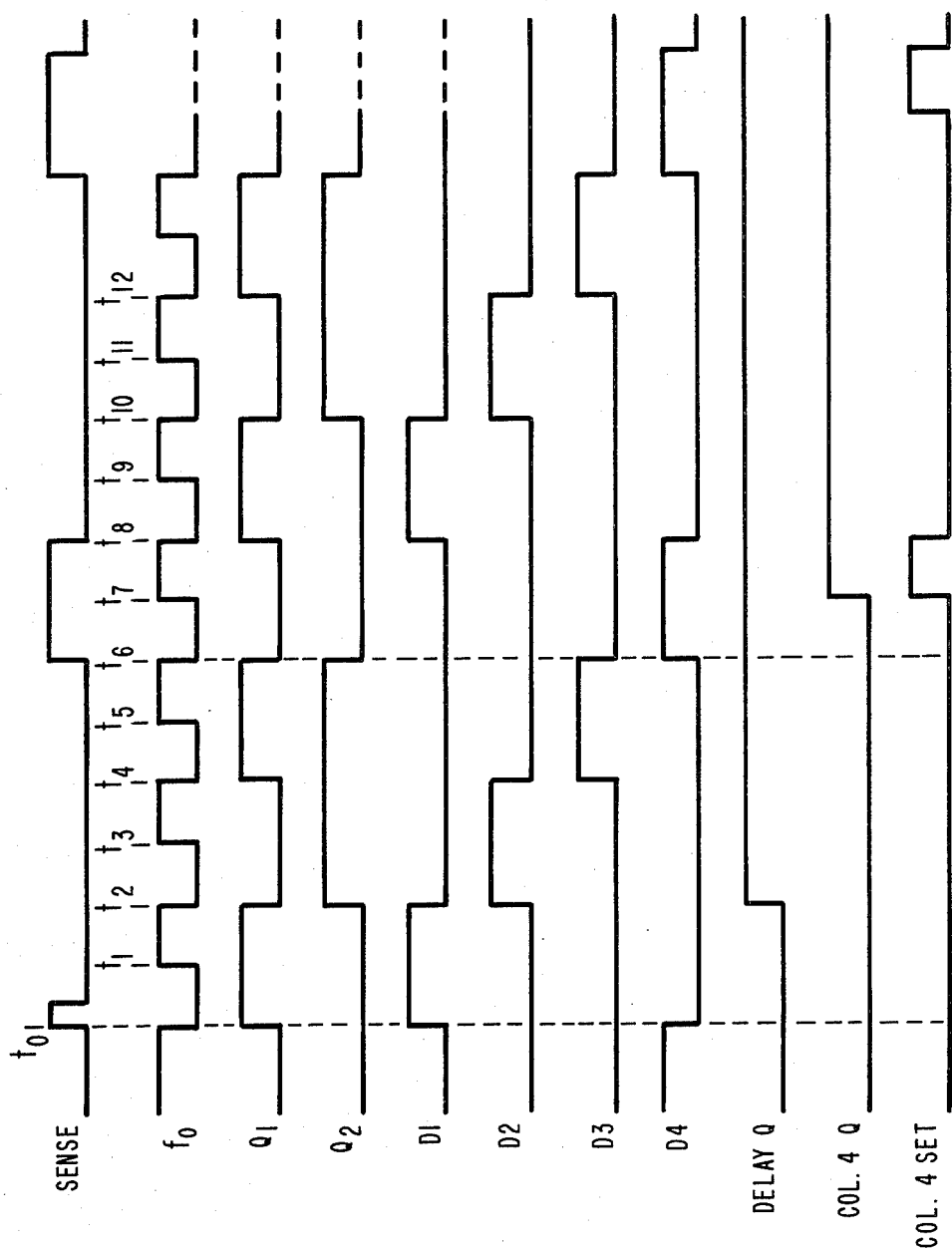
FIG. 3 is a diagram of waveforms associated with the circuit of FIGS. 1 and 2.

Decoder 213, which may be any one of a number of well-known decoders, has 4 inputs (Q1, $\overline{Q1}$, Q2 and $\overline{Q2}$) derived from the first 2 stages of counter 211 and produces 4 sequential output pulses at outputs D1, D2, D3, and D4 shown in waveforms "D1", "D2", "D3" and "D4" of FIG. 3. Each output Dj is applied to a NOR gate (NGj) controlling the conductivity of a column transistor Pj and to an AND gate (AGj) controlling the setting of the column flip-flop (CJj). The D1 output is high when Q1 is high and Q2 is low; the D2 output is high when Q1 is low and Q2 is high; the D3 output is high when Q1 and Q2 are high; and the D4 output is high when Q1 and Q2 are low. Therefore, signals D1, D2, D3 and D4 do not overlap. That is, only one of the signals Dj is high during any one period of time.

Control circuit 215 is designed to prevent a possible race condition. This circuit allows a column flip-flop to be set some time after the first sense signal has initiated a scanning cycle. The circuit includes a set-reset flip-flop DF1 whose set (S)-input is connected to output D2 of the decoder, whose reset (R)-input is connected to Q4 and whose Q output ($Q_D$) is connected to input #1 of a two input AND gate G7. The sense signal (node 22) is applied to the input #2 of G7 whose output (CL) is applied to one input (3) of the AND gates (AGj) controlling the setting of the column flip-flops.

Following a switch closure and the generation of a sense signal and the driving of Q4 from high to low the reset signal to DF1 is removed. The next positive going D2 pulse applied to the set input of DF1 causes its output $Q_D$ to go high, as shown in waveform "Delay Q" of FIG. 3. The next positive going sense signal produced after $Q_D$ goes high causes CL to go "high".

The gate electrode of each column transistor (Pj) is connected to the output of a corresponding two-input NOR gate (NGj). The first input #1 to each NGj gate is connected to a corresponding Dj decoder output. The second input #2 of each NGj gate is the Q4 signal. As already discussed, prior to a switch closure Q4 is high and the output of each NGj gate is low turning-ON all the column transistors. When Q4 goes low the output of each NGj gate will be driven high only when its other input— (which a decoder output)—goes high.

The set input of each column flip-flop (CFj) is connected to the output of a 3-input AND gate (AGj). The first input #1 of each AGj gate is connected to a corresponding Dj decoder output. The oscillator output $f_0$ is applied to input #2 of each AGj gates to strobe the gates; i.e. the AGj gates can produce a high output only when $f_0$ is high. The third input #3 of each AGj gate is connected to the output of G7. This connection ensures that a column flip-flop is set only after CL goes high. The output of an AGj gate goes "high" only when its 3 inputs are high. This occurs when the decoded input to the gate is high and when the strobe ($f_0$) and CL are high. CL is high after $Q_D$ goes high and whenever the sense signals goes high. When the output of an AGj gate goes high, it sets the Q output of the corresponding column flip-flop "high". As further detailed below, only that column flip-flop will be set which corresponds to a switch closure.

After the closing of switch S14 current source transistor (P4) with its gate electrode at, or close to, ground potentials conducts in the common source mode clamping, via its low ON impedance, its associated column conductor (e.g. C4) and the associated row line (e.g. R1) to terminal 16 to which is applied $V_{DD}$ volts. The $V_{DD}$ voltage ("high" or "1") level signal is applied to input #1 of G1 causing a "high" level "SENSE" signal to be produced at output 22, as shown for "SENSE" waveform at time $t_0$ in FIG. 3.

Normally, a key switch is depressed (closed) by a user for several milliseconds. During a switch closure period there will be multiple scans of the switch closure conduction as evident from the discussion below.

The first "high" sense signal resets counter flip-flops FF3 and FF4, causing Q4 to go from "high" to "low". When Q4 goes low, oscillator 209 starts running, the turn-on bias to the column transistors is removed, and the reset to the row and column flip-flops and to DF1 is also removed. The binary counter counts down as shown in waveforms "Q1" and "Q2" the oscillator output ($f_0$), and decoder outputs Dj are produced as shown in waveforms D1, D2, D3 and D4 of FIG. 3.

Following a switch closure and the production of the first (abbreviated) sense pulse the scanning of the column transistors is initiated, and the detection of the column conductor connected to a closed switch and the setting of the correct column flip-flop is achieved as described below.

When, sometime after the first sense pulse, the decoded output D1 goes high, the output of NG1 goes low, and P1 is turned-on. But, since C1 is not connected to any row conductor, no "SENSE" signal is generated (i.e. sense remains "low"). Hence, CL is low, the output of AG1 remains low, and, the Q of column 1 remains low. A similar sequence occurs when output D2 goes high after D1 goes low, and subsequently, when D3 goes high after D2 goes low. P2 and P3 are sequentially turned-on; but there is no connection from C2 and C3 to any row conductor. Hence, the sense output remains low, likewise the outputs of AG2 and AG3 remain low, and the outputs of CF2 and CF3 remain low.

When decoded output D4 goes high, at time $t_6$ in FIG. 3, the output of NG4 goes low, and P4 is turned-on, since S14 is closed $V_{DD}$ volts are again applied to R1 and a "high" "SENSE" pulse is produced. [This is the second high "Sense" pulse and follows the first high sense pulse at time $t_0$, as shown in FIG. 3.]

Beginning at time $t_6$ the output (CL) of G7 is high since the SENSE pulse and QD are high. At time $t_7$ in FIG. 3, the stobe signal $f_0$ goes high and the three-inputs to AG4 are high. This causes the output of AG4 and the set input to CF4 to go high, as shown for waveform "COL-4 SET" and FIG. 3. Q output of CF4 is then driven high as shown for waveform "COL-4-Q" and FIG. 3. Thus, at the end of one full cycle, the row flip-flop and the column flip-flop corresponding to the interconnected row and column conductors are set to indicate the switch closure location.

So long as a key switch (e.g. S14) is depressed RF3 and RF4 get reset by the "high" sense signal once each cycle. Therefore, Q4 remains at the "low" level for the full duration of the scan.

The scanning of the column circuitry terminates shortly after the switch (e.g. S14) is opened. When P4 is turned-on after S14 is opened the sense signal remains low (no "high"-sense pulse is produced). The oscillator keeps on running and eventually when Q2 goes from high-to-low, Q3 goes from low-to-high. Some time later Q3 goes from high-to-low causing Q4 to go from low-to-high. When Q4 goes high the following occurs:

1. All the row flip-flop are reset,
2. A high signal is applied to input #1 of G4 inhibiting the oscillator and driving node 15 high.
3. All the column flip-flop (CF1 through CF4) and the delay flip-flop DF1, are reset;
4. A "High" is applied to the second input #2 of gate NGj causing a turn-on bias (a zero level signal) to be applied to the gate electrodes of column transistors (Pj). Since all the key switches are open there is no conduction and no power dissipation. But, the circuit is ready to provide a "high" level signal when the next switch closure occurs.

It has, thus, seen shown that by using one circuit (e.g. the column transistor) as a load (non threshold dependent) for the other (row) circuit, which is threshold dependent, the system employing both circuits can be made to operate close to one threshold. The one threshold level may be in the range of 1 to 1.5 volts. This is in contrast to known circuits which would require a minimum of 2 to 3 volts to ensure operation. The invention was illustrated with the conduction paths of the Pj transistors in series with the column conductors and the gate-to-source of the Ni transistors connected between the row conductors and ground. It should be evident that, instead, the gate-to-source of the Pj transistors could be connected between the column conductors and $V_{DD}$ and the conduction paths of the Ni transistors could be connected between the row conductors and ground. The scanning circuitry would then be responsive to the outputs of the Pj transistors and would scan the row transistors.

Although this key sensing method uses scanning, it is important to note that it does not require the oscillator to run continuously. Specifically, the oscillator is not running when a key switch is not depressed.

It should also be noted that this system also works for multiple key operation (simultaneous depression of 2 or more keys). The multiple closures will be properly registered on the row and column flip-flops.

What is claimed is:

1. The combination comprising:
   first and second power terminals for the application therebetween of an operating potential;
   a matrix array of conductors comprising N column conductors and M row conductors, where N and M are integers greater than 1;
   a normally open, switch at the intersection of each row and column conductor; each switch, when closed, making a connection between its corresponding row and column conductors;
   N transistors and M transistors, each one of said N and M transistor having a control electrode and first and second electrodes defining the ends of its conduction path,
   there being one of said N transistors per column conductor, each of said N transistors having its conduction path connected between its column conductor and said first power terminal, and there being one of said M transistor per row conductor, each one of said M transistors having its control electrode connected to its row conductor and one end of its conduction path connected to said second power terminal; and pulse generating means coupled between the second electrodes of said M transistors and the control electrodes of said N transistors for, in response to a switch closure, producing scanning pulses which are sequentially applied to the control electrodes of said N transistors of a polarity to turn them on sequentially, each for a scans pulse duration, only that one of said N transistors whose conduction path is connected via a closed switch to a row conductor being rendered conductive and producing a signal indicating that a switch in the associated column is closed.

2. The combination as claimed in claim 1 wherein said M transistors are part of a first logic gate having an output at which is produced an output signal of given binary value each time a switch is closed.

3. The combination as claimed in claim 2 further including set-reset row flip-flops, one flip-flop per row conductor, each one of said set-reset flop-flops having its set input connected to its respective row conductor, and each flip-flop having an output set to a given binary value when its corresponding row conductor is connected via a closed switch to a column conductor.

4. The combination as claimed in claim 3 wherein said N transistors are insulated-gate field-effect transistors (IGFETs) of one conductivity type and said M transistors are IGFETs of complementary conductivity type to said one conductivity type, and wherein said N and M transistors are operated in the common source mode, when turned-on and rendered conductive.

5. The combination as claimed in claim 4 further including N set-reset column flip-flops, one flip-flop per column conductor, and N control gates, one control gate per column transistor; each control gate having input means and an output, the output of each control gate being connected to the control electrode of its respective column transistor.

6. The combination as claimed in claim 5 wherein the output of said first logic gate is connected to said pulse generating means, said pulse generating means including a decoder having N outputs one output per column, each one of said decoder outputs being connected to a respective control gate and to a corresponding column flip-flop, wherein said pulse generating means is activated in response to said output signal of given value; and wherein said pulse generating means, when activated, produces, in a particular sequence, non-overlapping, pulses of one binary significance at said decoder outputs.

7. The combination as claimed in claim 1 wherein said N transistors are normally turned-on, although non-conducting, in the absence of a switch closure; each one of said N transistors being turned-on following a switch closure only during its respective scan period.

8. The combination comprising:
first and second power terminals for the application therebetween of an operating potential;
a first set of N conductors, and a second set of M conductors; said N and M conductors being electrically isolated from each other, and said M conductors crossing said N conductors; where M and N are integers greater than 1;
MN signal-pole single-throw, normally open, switches, each at the intersection of a conductor of said first set with a conductor of said second set, each switch, when closed, making a connection between its two conductors;

N transistors and M transistors, each one of said N and M transistors having a control electrode and first and second electrodes defining the ends of its conduction path, one of said N transistors per conductor from said first sets of conductors, each one of said N transistors having its conduction path connected between its corresponding one of said N conductors and said first power terminal; one of said M transistors per conductor from said second set of M conductors, each one of said M transistors having is control electrode connected to its corresponding one of said M conductors and one end of its conduction path connected to said second power terminal; and normally non-conducting pulse generating means coupled between the second electrodes of said M transistors and the gate electrodes of said N transistors for, in response to a switch closure, producing scanning pulses which are sequentially applied to the control electrodes of said N transistors of a polarity to turn them on sequentially, each for a scan pulse duration, only that one of said N transistors whose conduction path is connected via a closed switch to a conductor from said second set being rendered conductive and producing a signal indicative of which one of said N conductors has a closed switch associated with it.

9. A keyboard system comprising:
first and second power terminals for the application therebetween of an operating potential;
a matrix array of conductors, electrically isolated from each other, comprising N column conductors and M row conductors, said N conductors crossing said M conductors where N and M are integers greater than 1;
a single-pole single-throw, normally open, key switch at the intersection of each row and column conductor; each switch when closed making a connection between its corresponding row and column conductor;
N circuits, one of said N circuits per column conductor; each one of said N circuits including a transistor having its conduction path connected between its column conductor and said first power terminal for normally providing a low impedance path between its column conductor and said first power terminal;
M threshold dependent circuits, one of said M circuits per row conductor, each one of said M circuits having an input terminal, a common terminal, and an output terminal, and being operable when the potential applied between its input and common terminal exceeds a given threshold level;
means connecting the input terminal of each one of said M circuits to its respective row conductor, and means connecting the common terminals to said second power terminal; and
normally non-conducting pulse generating means coupled between the output terminals of said M circuits and said N circuits for, in response to a switch closure, first removing the low impedance path between the column conductors and said first power terminal and then producing scanning pulses applied to said N circuits of a polarity and magnitude to energize them sequentially for a scan pulse duration, only that one of said N circuits whose column conductor is connected via a closed switch to a row conductor being rendered conductive and producing a signal indicative that a switch in the associated column is closed.

10. In a system in which a matrix of conductors, electrically isolated from each other, includes a first set of conductors and a second set of conductors with a switch connected at each intersection of a conductor from said first set with a conductor from said second set, in which circuitry is connected to the conductors of the first set and to the conductors of the second set to detect when a switch associated with a conductor from said first set and a conductor from said second set is closed, and in which said circuitry includes transistors having a control electrode and first and second electrodes defining the ends of a conduction path, said transistors being turned-on when the potential applied between said control and first electrode exceeds a threshold voltage ($V_T$); and in which said circuitry must be operable at operating voltages down to said threshold voltage, the improvement comprising:

a first circuit per conductor of said first set of conductors, each one of said first circuits including a first transistor having its conduction path connected between its corresponding conductor and a first power terminal;

a second circuit per conductor of said second set of conductors, each one of said second circuits including a second transistor having its control electrode connected to its respective conductor and its first electrode connected to a second power terminal; and a pulse generating means coupled between the second electrodes of said second transistors and the control electrodes of said first transistors for, in response to a switch closure, producing scanning pulses sequentially applied to the control electrodes of said first transistors of a polarity to turn them on sequentially for a scan pulse duration, only that one of said first transistors whose conduction path is connected via a closed switch to a row conductor being rendered conductive and producing a signal indicative that a switch in the associated column is closed.

* * * * *

UNITED STATES PATENT AND TRADEMARK OFFICE
CERTIFICATE OF CORRECTION

PATENT NO. : 4,318,087

DATED : March 2, 1982

INVENTOR(S) : Robert E. Wilson

It is certified that error appears in the above-identified patent and that said Letters Patent is hereby corrected as shown below:

Col. 3, line 4 change "gte" to --- gate ---.

Col. 5, line 41 change "190 1" to --- #1 ---.

line 54 change "$\overline{f_0}$" to --- $f_0$ ---.

line 54 change "$\overline{\emptyset}$" to --- $\emptyset$ ---.

Col. 9, line 7 change "scans" to --- scan ---.

Signed and Sealed this

Thirteenth Day of July 1982

[SEAL]

Attest:

GERALD J. MOSSINGHOFF

Attesting Officer     Commissioner of Patents and Trademarks